United States Patent
Perry et al.

(10) Patent No.: US 7,320,736 B2
(45) Date of Patent: Jan. 22, 2008

(54) HIGH-PURITY ALUMINUM SPUTTER TARGETS AND METHOD OF MANUFACTURE

(75) Inventors: Andrew C. Perry, Oradell, NJ (US); Paul S. Gilman, Suffern, NY (US); Thomas J. Hunt, Peekskill, NY (US)

(73) Assignee: Praxair Technology, Inc., Danbury, CT (US)

( * ) Notice: Subject to any disclaimer, the term of this patent is extended or adjusted under 35 U.S.C. 154(b) by 687 days.

(21) Appl. No.: 10/967,133

(22) Filed: Oct. 19, 2004

(65) Prior Publication Data
US 2005/0230011 A1    Oct. 20, 2005

Related U.S. Application Data

(60) Division of application No. 10/219,756, filed on Aug. 16, 2002, now Pat. No. 6,835,251, which is a continuation-in-part of application No. 10/054,345, filed on Nov. 13, 2001, now abandoned.

(51) Int. Cl.
*C22F 1/04* (2006.01)

(52) U.S. Cl. .................. 148/697; 148/690; 148/693

(58) Field of Classification Search ............... 148/437, 148/697
See application file for complete search history.

(56) References Cited

U.S. PATENT DOCUMENTS

| | | | |
|---|---|---|---|
| 5,993,575 A | 11/1999 | Lo et al. | 148/577 |
| 6,197,129 B1 | 3/2001 | Zhu et al. | 148/400 |
| 6,228,186 B1 | 5/2001 | Pavate et al. | 148/557 |
| 2001/0047838 A1 | 12/2001 | Segal et al. | 148/437 |

*Primary Examiner*—Roy King
*Assistant Examiner*—Weiping Zhu
(74) *Attorney, Agent, or Firm*—Iurie A. Schwartz

(57) ABSTRACT

The high-purity aluminum sputter target is at least 99.999 weight percent aluminum and has a grain structure. The grain structure is at least 99 percent recrystallized and has a grain size of less than 200 µm. The method forms high-purity aluminum sputter targets by first cooling a high-purity target blank to a temperature of less than −50 °C. and then deforming the cooled high-purity target blank introduces intense strain into the high-purity target. After deforming, recrystallizing the grains at a temperature below 200 °C. forms a target blank having at least 99 percent recrystallized grains. Finally, finishing at a low temperature sufficient to maintain the fine grain size of the high-purity target blank forms a finished sputter target.

10 Claims, 2 Drawing Sheets

HIGH-PURITY ALUMINUM SPUTTER TARGETS AND METHOD OF MANUFACTURE

This application is a divisional application of the U.S. Ser. No. 10/219,756 filed on Aug. 16, 2002 and patented on Dec. 28, 2004, U.S. Pat. No. 6,835,251, which is a continuation-in-part application of the U.S. Ser. No. 10/054,345, filed on Nov. 13, 2001 and abandoned.

BACKGROUND OF THE INVENTION

There has been a great deal of work on the refinement of microstructures based on cold-working and recrystallizing heat treatments (annealing). Unfortunately, these techniques have experienced limited success for refining pure aluminum microstructures. The highly-mobile grain boundaries in high-purity aluminum can allow spontaneous partial recrystallization to occur at room temperature under normal, ambient working conditions. In addition, high-purity aluminum does not have any precipitates or any significant amount of solute to provide the "Zener drag" necessary for effective retardation of grain boundary motion. Consequently, grain size is very difficult to control using conventional thermomechanical processing methods.

Historically, pure aluminum sputter targets have been manufactured with recrystallized grain sizes ranging typically from 500 μm to 5 mm. These "large" grain sizes can contribute to poor sputter uniformity. In addition, since these pure aluminum sputter targets have limited strength, they often require backing plates to control warping during sputtering. In view of these problems, there is a desire to improve the strength and sputtering performance for high-purity aluminum targets.

Target manufacturers have relied upon equal channel angular extrusion (ECAE) to produce fine grain microstructures. Nakashima et al., "Influence of Channel Angle on the Development of Ultrafine Grains in Equal-Channel Angular Pressing," Acta. Mater., Vol. 46, (1998), pp. 1589-1599 and R. Z. Valiev et al., "Structure and Mechanical Behavior of Ultrafine-Grained Metals and Alloys Subjected to Intense Plastic Deformation," Phys. Metal. Metallog., Vol. 85, (1998), pp. 367-377 provide examples of using ECAE to reduce grain size. ECAE introduces an enormous strain into a metal without imparting significant changes in workpiece shape. Although this process is effective for reducing grain size, it does not appear to align grains in a manner that facilitates uniform sputtering or provide an acceptable yield-the low yield originates from the ECAE process operating only with rectangular shaped plate and thus, requiring an inefficient step of cutting circular targets from the rectangular plate.

Another mechanical method for producing fine grain structures in metals is "accumulative roll bonding" where aluminum sheets are repeatedly stacked and rolled to impart sufficient strain required for ultra-fine grain sizes. N. Tsuji et al., "Ultra-Fine Grained Bulk Steel Produced by Accumulative Roll Bonding (ARB) Process," Scripta. Mater., Vol. 40, (1999), pp. 795-800. The repeated stacking and rolling allows rolling to continue after the aluminum reaches a critical thickness. Although this process is useful for producing some products, it is not necessarily applicable for sputtering targets because of material purity requirements.

Researchers have explored using cryogenic working to increase the forming limits of aluminum alloy sheet panels. For example, Selines et al. disclose a cryogenic process for deforming aluminum sheet in U.S. Pat. No. 4,159,217. This cryogenic process increases elongation and formability at −196° C. In addition, similar work has focussed on increasing the formability of sheet panels for automotive applications. Key references include: i) H. Asao et al., "Investigation of Cryogenic Working. I. Deformation Behaviour and Mechanism of Face-Centered Cubic Metals and Alloys at Cryogenic Temperature," J. Jpn. Soc. Technol. Plast., Vol. 26, (1985), pp. 1181-1187; and ii) H. Asao et al., "Investigation of Cryogenic Working. II. Effect of Temperature Exchange on Deformation Behavior of Face-Centered Cubic Metals and Alloys," J. Jpn. Soc. Technol. Plast., Vol. 29, (1988), pp. 1105-1111.

Lo, et al., in U.S. Pat. No. 5,766,380, entitled "Method for Fabricating Randomly Oriented Aluminum Alloy Sputtering Targets with Fine Grains and Fine Precipitates" disclose a cryogenic method for fabricating aluminum alloy sputter targets. This method uses cryogenic processing with a final annealing step to recrystallize the grains and control grain structure. Similarly, Y. Liu, in U.S. Pat. No. 5,993,621 uses cryogenic working and annealing to manipulate and enhance crystallographic texture of titanium sputter targets.

SUMMARY OF THE INVENTION

The invention is a high-purity aluminum sputter target. The sputter target is at least 99.999 weight percent aluminum and has a grain structure. The grain structure is at least 99 percent recrystallized and has a grain size of less than 200 μm.

The method of the invention forms high-purity aluminum sputter targets by first cooling a high-purity target blank to a temperature of less than about −50° C. The high-purity target blank has a purity of at least 99.999 percent and grains of a grain size. Then deforming the cooled high-purity target blank introduces intense strain into the high-purity target blank. And recrystallizing the grains at a temperature below about 200° C. forms a target blank having recrystallized grains. The target blank has at least about 99 percent recrystallized grains; and the recrystallized grains have a fine grain size. Finally, finishing the high-purity target blank at a low temperature sufficient to maintain the fine grain size forms a finished sputter target.

DETAILED DESCRIPTION

Figure 1:
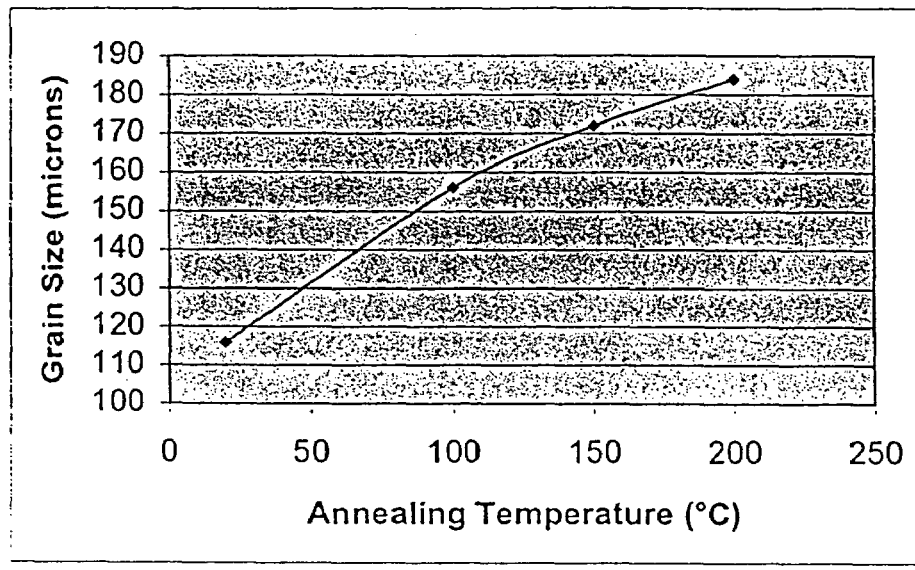
FIG. 1 is a plot of grain size as a function of annealing temperature for cryogenically deformed and recrystallized aluminum.

It has been discovered that lowering deformation temperature of high-purity aluminum to at least −50° C. lowers the temperature of the recrystallization event and results in a fine grain size. Then heating the target blank to a temperature less than 200° C. stabilizes the microstructure with a minimum amount of grain growth. This process produces a fine-grained-recrystallized structure having excellent stability at room temperature.

In particular, the process for manufacturing the aluminum targets first introduces severe plastic straining at cryogenic temperatures with the intent of increasing the number of viable new grain nucleation sites for subsequent activation during low-temperature recrystallization. This increases the number of nuclei (N) from intense plastic deformation, reduces the subsequent growth rate (G) of the new grains and results in a reduced recrystallized grain size.

Cryogenically worked pure aluminum has been shown to recrystallize at temperatures as low as −80° C. Furthermore, because grain growth involves short range atomic "jumping" across a grain boundary (grain boundary motion), temperature plays an important role in determining grain boundary mobility. The cryogenic process exploits reduced grain boundary mobility by forcing the recrystallization event to occur at low temperatures. Hence, cryogenic working maximizes the ratio of N to G by both the intense plastic straining and retarded dynamic recovery associated with deformation at cryogenic temperatures (increasing N), and the reduced growth rate of newly formed grains by allowing recrystallization to occur at lower temperatures (reducing G). Maximizing the ratio of N to G allows minimization of the recrystallized grain size. Then controlling grain growth during subsequent processing of the target blank into a finished sputter target maintains the resulting minimum grain size.

The broad application of lower-than-normal deformation temperatures by immersing target blanks in cooling baths immediately prior to forming operations achieves a highly-worked deformed state. Upon heating to room temperature or upquenching, new fully recrystallized grains of relatively small size replace the deformed grains.

This process produces high-purity aluminum having at least about 99 percent of the aluminum recrystallized. This process is effective for targets having an aluminum purity of at least 99.999 weight percent. In addition, this process is useful for targets having a purity of at least 99.9995 weight percent and most advantageously as high as 99.9999 weight percent aluminum.

The finished grains typically have a grain size of less than about 125 µm. For some applications, such as thick monoblock sputter targets, a grain size of less than about 200 µm is acceptable. This represents a significant improvement in grain size over standard high-purity aluminum targets. Furthermore, this process can advantageously maintain grain size to levels less than about 100 µm. Most advantageously, this process maintains grain size at levels below about 80 µm.

In addition, this process achieves a predominant (200) grain orientation ratio. For purposes of this specification, orientation ratio defines the relative proportion of a particular grain orientation in relation to total grains, expressed in percent as measured perpendicular to a sputter target's face. For example, measuring the intensity of an x-ray peak and dividing it by the relative intensity of that peak measured in a random orientation powder standard calculates grain orientation ratio. This ratio is then multiplied by 100 percent and normalized, i.e. divided by the sum of all grain orientation ratios between the intensities and their corresponding relative intensities.

The finished sputter target face advantageously has a grain orientation ratio of at least about 35 percent (200) orientation; and most advantageously it has at least about 40 percent (200) orientation. In addition, the sputter target face most advantageously has a grain orientation ratio of at least about forty percent (200) orientation and about 5 to 35 percent of each of the (111), (220) and (311) orientations. This combination of a weighted (200) orientation and balanced (111), (220) and (311) orientations provides the most uniform sputter properties from the sputter target face.

First cooling a high-purity target blank to a temperature of less than about −50° C. prepares the blank for deformation. The cooling medium may be any combination of solid or liquid $CO_2$, liquid nitrogen, liquid argon, helium, or other supercooled liquid. Advantageously, the process lowers the blank to about −80° C. Most advantageously, the process cools the blank to at least about −196° C. or 77 K. The most practical temperature for most applications is 77 K (liquid nitrogen at atmospheric pressure).

After cooling, deforming the cooled high-purity target blank introduces intense strain into the high-purity target blank. The deforming process may include processes such as, pressing, rolling, forging to achieve fine grain sizes in pure aluminum. During deformation, it is important to limit heating of the target blank. Furthermore, it is advantageous to enter an engineering strain of at least about 50 percent into the target blank. This strain ensures uniform microstructure through the target's thickness.

Rolling has proven to be the most advantageous method for reducing grain size and achieving the desired texture. In particular, multiple pass rolling, with re-cooling between passes provides the most advantageous results.

The grains in the target blank recrystallize at a temperature below about 200° C. At this temperature at least about 99 percent of the grains recrystallize. Advantageously, the grains recrystallize at a temperature below 100° C. Most advantageously, the grains recrystallize at a temperature below ambient temperature. As discussed above, minimizing the recrystallization temperature reduces the target's grain size.

Optionally, the process includes upquenching the high-purity target to a temperature less than about 200° C. to stabilize the grain size of the high-purity target. Most advantageously, upquenching is to a temperature less than about 150° C. For purposes of the specification, upquenching is the heating at a rate greater than air heating to ambient temperature. For example, quenching into alcohol, oil, water and combinations thereof provides a method for rapid recrystallization. Advantageously, the upquenching is in water. This eliminates the need to provide major cleaning after the upquenching step. Most advantageously, upquenching occurs by dipping the target blank into agitated water. Agitating the water limits ice formation. In addition, heating the water to about 100° C. can further improve upquenching. Optionally, the water bath may contain salt or antifreeze such as ethylene glycol or propylene glycol for improved upquenching. Since the primary purpose of the upquenching is to "lock in" an excellent grain size and texture on a consistent basis however, it is important to establish a consistent upquenching process.

The finishing of the high-purity target blank into a finished sputter target occurs at a temperature sufficient to maintain the fine grain size. If the sputter target is finished at too high of a temperature, then the beneficial grain size reduction is lost. Advantageously, the finishing occurs at a temperature less than about 200° C. to limit grain growth. Reducing finishing temperature to less than about 100° C. further decreases grain growth during finishing. Most advantageously, the finishing occurs at ambient temperature.

EXAMPLE 1

This Example used full-size CVC-type sputter targets fabricated from aluminum having a purity of at least 99.9995 percent. The final target blank dimensions are a diameter of 12.0" (30.5 cm) and a thickness of 0.25" (0.64 cm). Table 1 provides the manufacturing process specified for this target. In the cryogenic-pressing step (step 2), an operator immersed a 5.1" (13.0 cm) diameter by 3" (7.6 cm) long workpiece in liquid nitrogen until visible boiling was no longer observed; the workpiece was then at a temperature of approximately 77 K or −196° C. Re-cooling the cryogenically processed billets between each pressing step ensured that the imposed deformation took place at a temperature as close to −196° C. or 77 K as reasonably possible.

Initial cooling and re-cooling steps extended until the workpiece no longer boiled the liquid nitrogen that surrounded its surface. Immediately after immersing room temperature metals in liquid nitrogen, the liquid adjacent to the metal surface boiled so rapidly that it formed an unbroken gas film that surrounded the workpiece or underwent "film boiling". During film boiling, the gas barrier limited heat transfer. As the temperature of the workpiece decreased and the metal approached −196° C., the gas film barrier began to break down and the liquid contacted the metal surface before boiling. Heat transfer was relatively rapid during this "nucleate boiling" stage. The boiling rate during nucleate boiling was significantly higher than that of film boiling. An interesting observation from the full-scale trials was that when the workpieces approached −196° C., an audible change in boiling state signaled the transition from film to nucleate boiling.

After pre-cooling was complete, pressing the aluminum between flat dies in two steps (approximately equal reductions) reduced the thickness to a final height of 1" (2.5 cm). Between the two reduction steps, immersing the workpiece in the liquid nitrogen bath re-cooled the work piece to approximately 77 K or −196° C. In between pressing steps and after pressing was complete, immediately transferring the workpiece into the liquid nitrogen bath the workpiece prevented the temperature of the workpiece from exceeding −80° C. This facilitated retaining the maximum stored strain energy imparted by the pressing operations.

In step 3, transferring the workpiece quickly from the liquid nitrogen bath at 77 K or −196° C. to the rolling mill minimized recrystallization before the cryogenic rolling. The cryogenic rolling consisted of taking approximately 0.040" (0.10 cm) per pass, with a re-cooling step by immersion in the liquid nitrogen bath between each rolling pass. As was the case with the pressing steps, it is important that the workpiece be immediately transferred to the liquid nitrogen bath after each rolling pass to ensure that the temperature of the target blank stays as low as possible. After cryogenic rolling is complete, the workpiece returns to ambient temperature. In step 7, epoxy bonding replaced traditional solder bonding in order to prevent grain growth that may result from exposure to the elevated solder temperatures.

It is important to note that because recrystallization of the cryogenically deformed aluminum occurs at a temperature of approximately −80° C., there is no recrystallization heat treatment required before or after the finish fabrication sequence. For experimental purposes, however, annealing several test pieces at different annealing temperatures was useful for evaluating the effects that an annealing step may have on the microstructure and texture of the cryogenically deformed aluminum.

TABLE 1

Processing Steps used for Fine Grained Pure Aluminum Target

| Step | Description |
|------|-------------|
| 1 | Cut 3" (7.6 cm) length of 130 mm diameter Al 99.9995% billet |
| 2 | Cryogenically press 3" (7.6 cm) to 1.7" (4.3 cm) to 1" (2.5 cm) final height |
| 3 | Cryogenically roll taking 0.040" (0.10 cm) per pass to 0.325" (0.83 cm) |
| 4 | Water jet cut to diameter of 12.125" (30.8 cm) |
| 5 | Machine both sides to thickness of 0.270" (0.68 cm) |
| 6 | Ultrasonic inspection for low inclusion content |
| 7 | Epoxy bond to backing plate |
| 8 | Machine assembly to finished dimensions |
| 9 | Ultrasonic inspection of bond integrity |
| 10 | Clean and degrease |
| 11 | Inspect and test |

Metallographic and X-ray diffraction analyses originated from water-jet cut samples taken from the outer ring of the target blank. FIG. 1 plots the grain size results from a sample in the as-deformed condition as well as several samples that were annealed at temperatures ranging from 100 to 200° C. (ASTM E-112 methods determined grain size for the Examples). The measurements reported in FIG. 1 were from samples annealed 4 hours at their specified temperature, with the exception of the first datum, which is the as deformed grain size (assigned an annealing temperature of 20° C.). As expected, increasing annealing temperatures corresponded to larger grain sizes. The measured grain size of the as-deformed sample was 116 μm—this is significantly more fine than standard commercial high-purity aluminum sputter targets.

Figure 2:
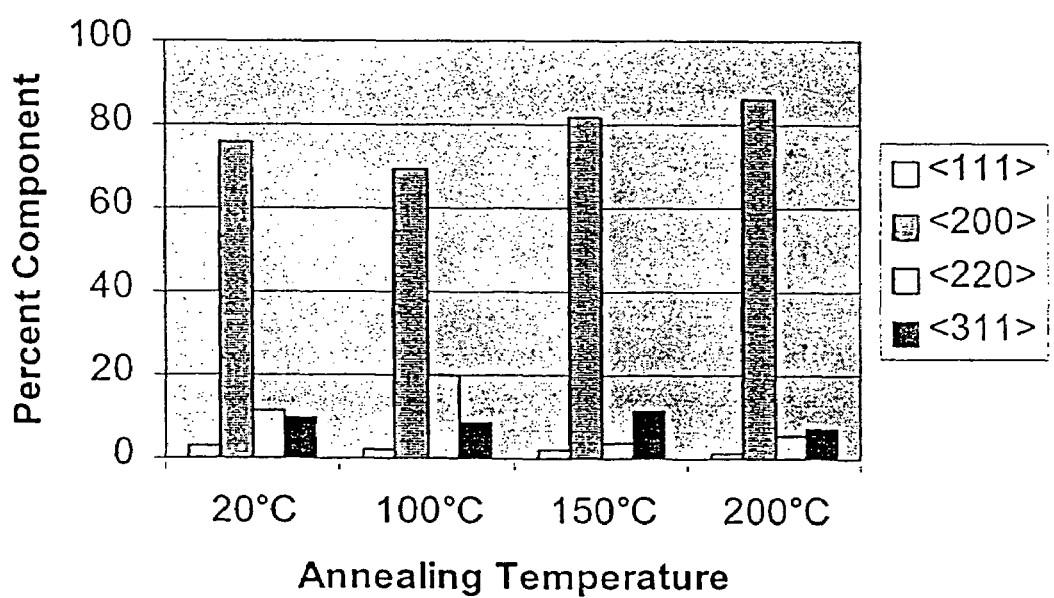
FIG. 2 is a plot of orientation ratio versus annealing temperature for the samples of FIG. 1.

Referring to FIG. 2, the X-ray diffraction data for the as-deformed samples (assigned a 20° C. annealing temperature) as well as the annealed samples showed little change in texture for annealing temperatures up to 200° C.; and all specimens exhibited a 100 percent recrystallized microstructure having a predominant (200) texture. This texture can provide improved sputter performance for fcc metal targets, such as high-purity aluminum sputter targets. Sputter testing of these targets also showed improved uniformity in comparison to targets fabricated by conventional thermomechanical techniques.

EXAMPLE 2

A series of full-scale manufacturing experiments examined the microstructure consistency of five target blanks from three different material lots manufactured to the specifications for thermomechanical processing provided above in Example 1. Sectioning the blanks (including material from each of the three different lots) provided samples for metallographic analysis and determining crystallographic texture. The texture analyses and grain size measurements showed a consistent texture and grain size throughout each target. This was consistent from target to target as well as in all five blanks from the three different material lots.

Diffraction data collected from the target surface in the erosion groove regions of each blank (two locations per target) at 1.850" (4.70 cm) and 5.125" (13.02 cm) distances from the target center provided grain orientation data. Similarly, grain size measurements locations were at near-surface and mid-thickness regions from three target as follows: near-edge 5.125 in. (13.02 cm); half-radius 1.85 in.(4.70 cm); and center per blank.

Figure 3A:
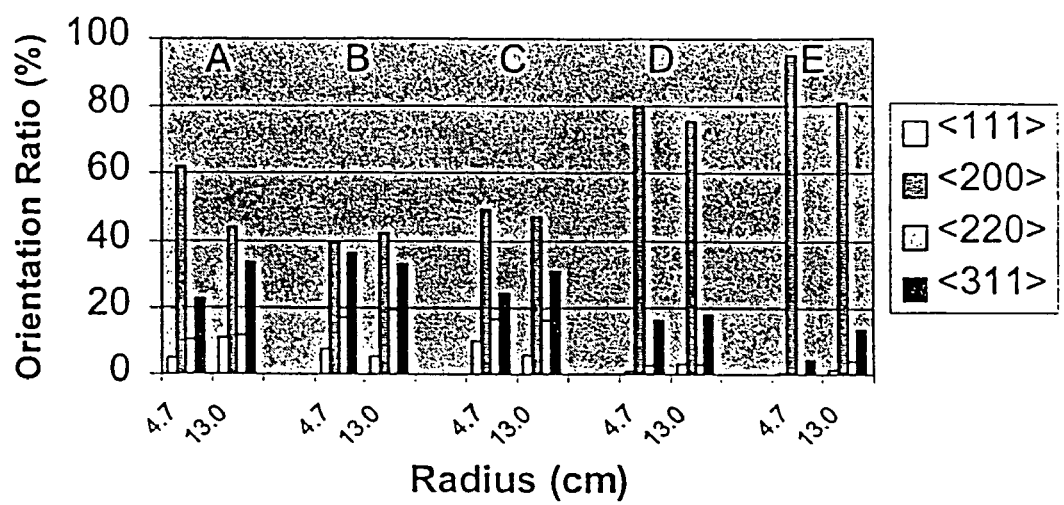
FIG. 3A shows the orientation ratios for five comparative target blanks from three lots of the conventional thermomechanically processed targets of Example 2.

X-ray diffraction analysis determined crystallographic texture of the-target blanks. FIG. 3A shows the XRD results for five conventionally processed high-purity aluminum target blanks from three different lots (Comparative Blanks A-E). The spread of these results are demonstrative of the difficulties often encountered when trying to control texture in pure aluminum targets. In particular, the crystallographic texture was difficult to control and often had a high degree of target-to-target variation. Furthermore in-target variation can also be a problem in conventionally-processed pure aluminum targets.

Figure 3B:
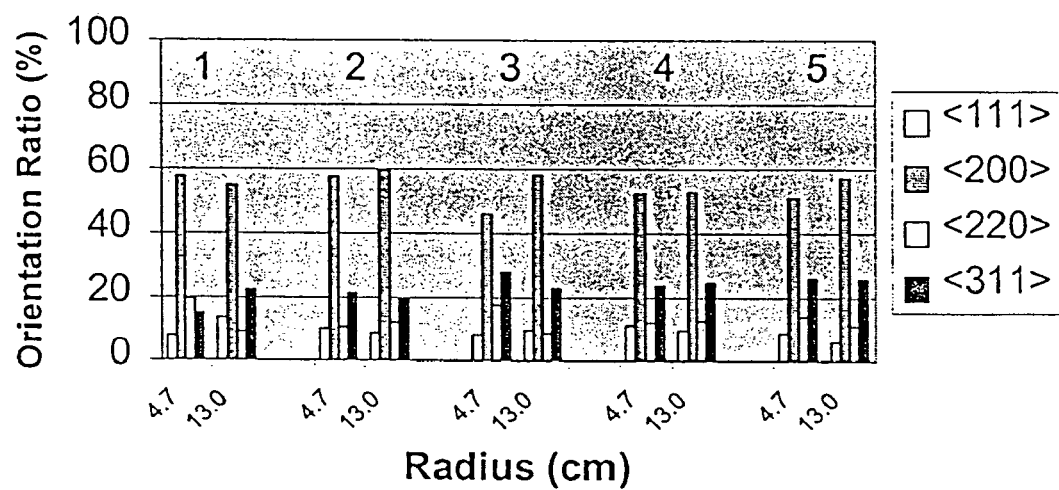
FIG. 3B shows the orientation ratios for the five cryogenically-processed target blanks from three lots of Example 2.

FIG. 3B shows the XRD results for the remaining five cryogenically deformed target blanks from the three lots (Sample Blanks 1 to 5). These results illustrated good in-target uniformity as well as excellent target-to-target consistency resulting from the cryogenic process.

Table 2 lists the grain sizes measured from the target blanks.

TABLE 2

Grain Size Results (μm)

| Sample ID | Location | Near Surface | Mid-thickness | Sample Average | Standard Deviation |
|---|---|---|---|---|---|
| 1 | Edge | 119 | 127 | 115 | 8.50 |
|   | Half-Radius | 101 | 113 | | |
|   | Center | 116 | 115 | | |
| 2 | Edge | 107 | 94 | 108 | 9.90 |
|   | Half-Radius | 108 | 118 | | |
|   | Center | 120 | 101 | | |
| 3 | Edge | 115 | 132 | 131 | 12.90 |
|   | Half-Radius | 146 | 146 | | |
|   | Center | 121 | 126 | | |
| 4 | Edge | 92 | 113 | 117 | 20.89 |
|   | Half-Radius | 135 | 149 | | |
|   | Center | 110 | 105 | | |
| 5 | Edge | 101 | 112 | 106 | 7.36 |
|   | Half-Radius | 110 | 113 | | |
|   | Center | 107 | 94 | | |

The overall average grain size from the five blanks was 115 μm; and all samples contained one-hundred percent recrystallized grains.

EXAMPLE 3

The sequence listed in Table 3 provided the process for fabricating five target blanks from three different material lots. The initial billets had dimensions as follows: 130 mm diameter×89 mm length and the finished blanks had dimensions of 305 mm diameter and 11.1 mm thickness.

TABLE 3

Manufacturing Process for Fine-Grain Recrystallized Pure Aluminum Targets

| Step | Process |
|---|---|
| 1 | Cut 5.1" (13.0 cm) diameter billet to 3.5" (8.9 cm) length |
| 2 | Cool part in liquid nitrogen |
| 3 | Remove from bath and cryo-press to height of 2.5" (6.4 cm) |
| 4 | Immediately re-cool in liquid nitrogen |
| 5 | Cryo-press to final height of 1.5" (3.8 cm) |
| 6 | Re-cool in liquid nitrogen |
| 7 | Upquench in water |
| 8 | Re-cool in liquid nitrogen |
| 9 | Cryo-roll 0.100" (0.25 cm) per pass to a final thickness of 0.550" (1.40 cm) |
| 10 | Upquench in water |
| 11 | Anneal for four hours at 200° C. |
| 12 | Waterjet cut OD to 11.750" (29.8 cm) |
| 13 | Machine both sides to final rough thickness of 0.485" (1.2 cm) prior to bonding |

The microstructures and crystallographic textures of these five blanks were characterized completely for uniformity in-target and target-to-target consistency. As in Example 2, the 100 percent recrystallized targets produced excellent crystallographic orientation and in-target and target-to-target consistency. Furthermore, these upquenched targets showed an improvement in grain size and microstructural uniformity.

Additionally, five other target blanks from the same three material lots were manufactured with the same process and were solder bonded to backing plates and finish machined to be made available for sputter testing. Sputter testing of these targets showed improved uniformity in comparison to targets fabricated by conventional thermomechanical techniques.

EXAMPLE 4

Varying several processing parameters used in cryogenic processing of pure Al quantified each parameter's effect on grain size. In particular, varying cryogenic pressing strain, cryogenic rolling strain, and heating rate following cryogenic deformation with the process of Example 3 determined each parameter's effectiveness at reducing grain size.

Table 4 shows the experimental matrix as well as the measured responses and grain size for each of the experiments.

TABLE 4

| Blank | Pressing Strain | Rolling Strain | Healing Rate Media | Grain Size |
|---|---|---|---|---|
| 6 | 0.59 | 1.17 | Water Quench | 88 |
| 7 | 0.59 | 1.17 | Slow Heat | 118 |
| 8 | 0.18 | 0.18 | Water Quench | 198 |
| 9 | 1.00 | 1.00 | Slow Heat | 112 |
| 10 | 0.01 | 0.59 | Slow Heat | 146 |
| 11 | 0.59 | 0.01 | Water Quench | 194 |
| 12 | 0.18 | 1.00 | Slow Heat | 98 |
| 13 | 1.17 | 0.59 | Slow Heat | 152 |
| 14 | 0.18 | 1.00 | Water Quench | 91 |
| 15 | 1.00 | 0.18 | Slow Heat | 190 |
| 16 | 1.00 | 0.18 | Water Quench | 182 |
| 17 | 0.01 | 0.59 | Water Quench | 118 |
| 18 | 1.17 | 0.59 | Water Quench | 152 |
| 19 | 1.00 | 1.00 | Water Quench | 132 |
| 20 | 0.59 | 0.01 | Water Quench | 188 |
| 21 | 0.18 | 0.18 | Slow Heat | 274 |

The results of Table 4 illustrate that rolling strain had a much more refining impact on grain size as compared to pressing strain. The upquenching resulted consistently in a more refined grain size of a consistent predominant (200) texture. In addition, the grains were 100 percent recrystallized.

EXAMPLE 5

Cryogenic processing a monoblock-style sputter targets also provided microstructural advantage. A 130 mm billet of pure aluminum was cut to a length of 343 mm and cold upset to a height of 203 mm. Cryogenic upset pressing the billet, using the cryogenic deformation procedure described in Example 1, was conducted in four steps (equal percent reductions per step) to a final height of 102 mm. The upset billet was then cryogenic cross-rolled, using the procedures described in Example 1, to a final billet thickness of 46 mm, with 5 mm reduction per rolling pass. After cryogenic rolling, upquenching in room-temperature water to rapidly heat the workpiece back up to room temperature was the final process step affecting microstructure. Processing as described above resulted in an average grain size of 155 microns and the preferred crystallographic texture illustrated in ambient temperature "annealed" condition of FIG. 2. The finished workpiece was directly machined into a finished sputter target at ambient temperature to maintain the enhanced microstructure.

The experimental procedure that resulted in the finest possible grain size consisted of cryogenic deformation followed by "up quenching" of the deformed workpiece immediately after rolling from cryogenic temperatures to approximately 50° C. in warm water. The technique of taking a cold-deformed metal rapidly up to its recrystallization temperature results in a more uniform grain size and texture. Apparently, rapid heating increases the number of viable new grain nuclei during the early stages of recrystallization and decreases the time it takes for the new grains to impinge upon one another to ensure a fine-recrystallized grain structure.

The process can fabricate targets of any shape including circular-shaped targets and sheet-like-rectangular-shaped targets. Furthermore, since the targets formed from this process have good strength, they also allow forming the targets directly into monoblock structures. This avoids the costs associated with bonding a target to a backing plate and increases the useful thickness of the sputter target.

With the cryogenic process, it's possible to achieve minimum grain sizes as fine as 50 to 80 μm in monoblock-designed pure aluminum targets. Furthermore, reducing grain size improves sputter uniformity in comparison to conventional high-purity sputter targets that are annealed at temperatures above 200° C. In addition, the process provides a more consistent product than conventional wrought methods. Finally, the target contains a recrystallized-textured (200) grain that further facilitates uniform sputtering.

Although the invention has been described in detail with reference to certain preferred embodiments, those skilled in the art will recognize that there are other embodiments of the invention within the spirit and the scope of the claims.

We claim:

1. A method of forming high-purity aluminum sputter targets comprising the steps of:
    a) cooling a high-purity target blank to a temperature of less than about −50° C., the high-purity target blank having a purity of at least 99.999 percent and grains having a grain size;
    b) deforming the cooled high-purity target blank to introduce strain into the high-purity target blank and to reduce the grain size of the grains;
    c) recrystallizing the grains at a temperature below about 200° C. to form a target blank having recrystallized grains, the target blank having at least about 99 percent recrystallized grains and the recrystallized grains having a fine grain size; and
    d) finishing the high-purity target blank to form a finished sputter target at a low temperature sufficient to maintain the fine grain size of the finished sputter target.

2. The method of claim 1 including the additional step of upquenching the high-purity target to a temperature less than about 200° C. to stabilize the grain size of the high-purity target.

3. The method of claim 1 wherein the deforming is rolling.

4. The method of claim 3 wherein the rolling is multiple pass rolling and including the additional step of cooling the target blank between rolling passes.

5. A method of forming high-purity aluminum sputter targets comprising the steps of:
    a) cooling a high-purity target blank to a temperature of less than about −50° C., the high-purity target blank having a purity of at least 99.999 percent and grains having a grain size;
    b) deforming the cooled high-purity target blank to introduce strain into the high-purity target blank and to reduce the grain size of the grains;
    c) recrystallizing the grains at a temperature below about 200° C. to form a target blank having recrystallized grains, the target blank having at least about 99 percent recrystallized grains and the recrystallized grains having a fine grain size of less than about 125 μm; and
    d) finishing the high-purity target blank to form a finished sputter target at a low temperature sufficient to maintain the fine grain size of the finished sputter target at less than about 125 μm.

6. The method of claim 5 including the additional step of upquenching the high-purity target to a temperature less than about 150° C. to stabilize the grain size of the high-purity target.

7. The method of claim 5 wherein the upquenching is into a liquid bath selected from the group consisting of oil, water, alcohol and mixtures thereof.

8. The method of claim 7 wherein the upquenching is into agitated water.

9. The method of claim 5 wherein the deforming is rolling.

10. The method of claim 9 wherein the rolling is multiple pass rolling and including the additional step of cooling the target blank between rolling passes.

* * * * *

UNITED STATES PATENT AND TRADEMARK OFFICE
CERTIFICATE OF CORRECTION

PATENT NO. : 7,320,736 B2
APPLICATION NO. : 10/967133
DATED : January 22, 2008
INVENTOR(S) : Perry et al.

It is certified that error appears in the above-identified patent and that said Letters Patent is hereby corrected as shown below:

Col 9, in claim 1, after "A method of forming high-purity aluminum sputter targets", insert --, the sputter target being at least 99.999 weight percent aluminum and having a grain structure, the grain structure being at least about 99 percent recrystallized and having a grain size of less than about 200 µm, wherein the sputter target has a sputter target face for sputtering the sputter target; and the sputter target face has a grain orientation ratio of at least about 35 percent (200) orientation and about 5 to 35 percent of each of the (111), (220) and (311) orientations--

In claim 5, after "A method of forming high-purity aluminum sputter targets", insert --, the sputter target being at least 99.999 weight percent aluminum and having a grain structure, the grain structure being at least about 99 percent recrystallized and having a grain size of less than about 200 µm, wherein the sputter target has a sputter target face for sputtering the sputter target; and the sputter target face has a grain orientation ratio of at least about 35 percent (200) orientation and about 5 to 35 percent of each of the (111), (220) and (311) orientations--

Signed and Sealed this

Twentieth Day of May, 2008

JON W. DUDAS
*Director of the United States Patent and Trademark Office*

UNITED STATES PATENT AND TRADEMARK OFFICE
CERTIFICATE OF CORRECTION

PATENT NO. : 7,320,736 B2
APPLICATION NO. : 10/967133
DATED : January 22, 2008
INVENTOR(S) : Perry et al.

It is certified that error appears in the above-identified patent and that said Letters Patent is hereby corrected as shown below:

Col 9, in claim 1, line 61, after "A method of forming high-purity aluminum sputter targets", insert --, the sputter target being at least 99.999 weight percent aluminum and having a grain structure, the grain structure being at least about 99 percent recrystallized and having a grain size of less than about 200 µm, wherein the sputter target has a sputter target face for sputtering the sputter target; and the sputter target face has a grain orientation ratio of at least about 35 percent (200) orientation and about 5 to 35 percent of each of the (111), (220) and (311) orientations--

Column 10, claim 5, line 26, after "A method of forming high-purity aluminum sputter targets", insert --, the sputter target being at least 99.999 weight percent aluminum and having a grain structure, the grain structure being at least about 99 percent recrystallized and having a grain size of less than about 200 µm, wherein the sputter target has a sputter target face for sputtering the sputter target; and the sputter target face has a grain orientation ratio of at least about 35 percent (200) orientation and about 5 to 35 percent of each of the (111), (220) and (311) orientations--

This certificate supersedes the Certificate of Correction issued May 20, 2008.

Signed and Sealed this

Seventeenth Day of June, 2008

JON W. DUDAS
*Director of the United States Patent and Trademark Office*